United States Patent
Pramanik et al.

(10) Patent No.: US 7,672,113 B2
(45) Date of Patent: Mar. 2, 2010

(54) POLYMER-CERAMIC COMPOSITES WITH EXCELLENT TCC

(75) Inventors: Pranabes K. Pramanik, Clifton Park, NY (US); Jaclyn Radewitz, Slingerlands, NY (US); Kazuhiro Yamazaki, Ageo (JP)

(73) Assignee: Oak-Mitsui, Inc., Hoosick Falls, NY (US)

( * ) Notice: Subject to any disclaimer, the term of this patent is extended or adjusted under 35 U.S.C. 154(b) by 381 days.

(21) Appl. No.: 11/855,428

(22) Filed: Sep. 14, 2007

(65) Prior Publication Data

US 2009/0073636 A1 Mar. 19, 2009

(51) Int. Cl.
*H01G 4/06* (2006.01)

(52) U.S. Cl. .................. 361/321.4; 361/311; 361/313; 361/321.5; 361/321.2; 361/303

(58) Field of Classification Search .............. 361/321.4, 361/303, 305, 311–313, 321.1, 321.2, 321.5, 361/306.1, 306.3; 501/136–139; 252/62.2
See application file for complete search history.

(56) References Cited

U.S. PATENT DOCUMENTS

| | | | | |
|---|---|---|---|---|
| 5,169,551 A | * | 12/1992 | Tsunooka et al. | 252/62.9 R |
| 5,707,782 A | * | 1/1998 | Economy et al. | 430/285.1 |
| 6,215,649 B1 | * | 4/2001 | Appelt et al. | 361/312 |
| 6,524,522 B2 | * | 2/2003 | Vaidyanathan et al. | 419/2 |
| 6,657,849 B1 | * | 12/2003 | Andresakis et al. | 361/311 |
| 7,382,627 B2 | * | 6/2008 | Borland et al. | 361/763 |
| 2005/0195554 A1 | | 9/2005 | Borland et al. | 361/303 |
| 2007/0087929 A1 | | 4/2007 | Park et al. | 501/100 |
| 2007/0097597 A1 | | 5/2007 | Ko et al. | 361/311 |
| 2007/0178232 A1 | | 8/2007 | Kodas et al. | 427/180 |

* cited by examiner

*Primary Examiner*—Nguyen T Ha
(74) *Attorney, Agent, or Firm*—Roberts & Roberts, LLP (57) ABSTRACT

Polymer-ceramic composite materials for use in the formation of capacitors, which materials exhibit very low changes in temperature coefficient of capacitance (TCC) in response to changes in temperature within the range of from about −55° C. to about 125° C. Specifically, these capacitor materials have a change in TCC ranging from about −5% to about +5%, in response to changes in temperature within the desired temperature range. The inventive composite materials comprise a blend of a polymer component and ferroelectric ceramic particles, wherein the polymer component includes at least one epoxy-containing polymer, and at least one polymer having epoxy-reactive groups. The inventive polymer-ceramic composite materials have excellent mechanical properties such as improved peel strength and lack of brittleness, electrical properties such as high dielectric constant, and improved processing characteristics.

27 Claims, 3 Drawing Sheets

TCC characteristics of polymer-ceramic composites (+/− 5.0%)

FIG.1

TCC characteristics of polymer-ceramic composites (+/- 5.0%)

FIG. 2
TCC characteristics of polymer-ceramic composites (+/- 2.5%)

FIG. 3

TCC characteristics of polymer-ceramic composites (+/- 0.5%)

POLYMER-CERAMIC COMPOSITES WITH EXCELLENT TCC

BACKGROUND OF THE INVENTION

1. Field of the Invention

The present invention relates to the field of capacitors and printed circuit boards. In particular, it relates to polymer-ceramic composite materials for use in the formation of capacitors and printed circuit boards. The inventive composite materials exhibit a low change in temperature coefficient of capacitance (TCC) in response to temperature changes, as well as other desirable properties.

2. Description of the Related Art

As the circuitry design of central processing units (CPU) seeks to achieve increased operational speed, the performance of integrated circuits becomes ever more important. The circuitry design of printed circuit boards, which mount these integrated circuits, is also very important.

Capacitors are common elements of printed circuit boards and other microelectronic devices. They are used to steady the operational power supply of such devices. Capacitance is a measure of the energy storage ability of a capacitor. A capacitor introduces capacitance into a circuit and functions primarily to store electrical energy, block the flow of direct current, or permit the flow of alternating current. Typically, capacitors comprise a dielectric material sandwiched between two electrically conductive metal layers, such as copper foils. In general, the dielectric material is coupled to the electrically conductive metal layers via an adhesive layer, by lamination, or by vapor deposition.

Heretofore, capacitors arranged on the surface of printed circuit boards have been common. In recent efforts to miniaturize capacitors, it has been known to either use a dielectric ceramic material with a high dielectric constant, or to decrease the thickness of dielectric ceramic layers. The capacitance depends primarily on the shape and size of the capacitor layers and the dielectric constant of the insulating material. In one known arrangement, "embedded" capacitors comprising thin, double-sided copper clad laminates have been formed within multilayered circuit board layers, producing excellent characteristics. Printed circuit boards having such embedded capacitors are able to maximize the surface area of the circuit board for other purposes, and achieve increased signal transmission speed.

Capacitors with high capacitance density are particularly desirable. The capacitance density of dielectric materials can be increased by the addition of ceramic materials. However, the high loading of ceramic filler materials into a dielectric material often results in a composite which is brittle, and which has very low mechanical and processing properties. Such high capacitance density materials are also known to exhibit large changes in capacitance due to changes in temperature. Additionally, materials having high dielectric constants are also known to be sensitive to temperature changes. Materials with such temperature dependencies of capacitance are known to have a high "temperature coefficient of capacitance" or TCC. A material's TCC indicates its maximum change in capacitance over a specified temperature range. Conventional dielectric composite capacitor materials have been developed which have a change in TCC of from as low as ±15% to as low as ±10% over a temperature range of from about −55° C. to about 125° C. However, a need exists in the field of printed circuit boards to develop capacitor materials, and particularly embedded capacitor materials having a very low change in TCC in the range of from about −5% to about +5%, and preferably as low as from about −0.5% to about +0.5%, in response to changes in temperature within the range of from about −55° C. to about 125° C. The present invention provides a unique polymer-ceramic composite material which achieves this goal. The inventive composite materials additionally have excellent mechanical properties such as good peel strength and lack of brittleness, electrical properties such as high dielectric constant, and processing characteristics such as ease of mixing.

SUMMARY OF THE INVENTION

The invention provides a composite material which comprises a blend of a polymer component and ferroelectric ceramic particles, which polymer component comprises at least one epoxy containing polymer, in an amount of from about 5 wt. % to about 95 wt. % based on the weight of the polymer component, and at least one polymer having a plurality of epoxy-reactive groups in an amount of from about 5 wt. % to about 95 wt. % based on the weight of the polymer component, wherein the composite material exhibits a change in temperature coefficient of capacitance of from about −5% to about +5%, responsive to a temperature change within the range of from about −55° C. to about 125° C.

The invention further provides a composite material which comprises a blend of a polymer component and a ferroelectric ceramic powder, which polymer component comprises at least one epoxy containing polymer, in an amount of from about 5 wt. % to about 95 wt. % based on the weight of the polymer component, and at least one polymer having a plurality of epoxy-reactive groups in an amount of from about 5 wt. % to about 95 wt. % based on the weight of the polymer component;

wherein the ferroelectric ceramic powder comprises barium titanate, strontium titanate, barium strontium titanate, or combinations thereof;

wherein the epoxy containing polymer comprises a phenol novolak epoxy, an epoxy having an aliphatic or aromatic hydrocarbon backbone derived from bisphenol A or bisphenol F, a butadiene-acrylic modified epoxy, or combinations thereof;

wherein the polymer having a plurality of epoxy-reactive groups comprises a polyimide, a polyamideimide, a polyvinyl butyral, a polyethersulphone, a reactive polyester, or combinations thereof; and wherein the composite material exhibits a change in temperature coefficient of capacitance of from about −5% to about +5%, responsive to a temperature change within the range of from about −55° C. to about 125° C.

The invention still further provides a method for forming a capacitor which comprises:

a) providing a composite material which comprises a blend of a polymer component and ferroelectric ceramic particles, which polymer component comprises at least one epoxy containing polymer, in an amount of from about 5 wt. % to about 95 wt. % based on the weight of the polymer component, and at least one polymer having a plurality of epoxy-reactive groups in an amount of from about 5 wt. % to about 95 wt. % based on the weight of the polymer component, wherein the composite material exhibits a change in temperature coefficient of capacitance of from about −5% to about +5%, responsive to a temperature change within the range of from about −55° C. to about 125° C.; and b) attaching a layer of the composite material between a first electrically conductive layer and a second electrically conductive layer.

DETAILED DESCRIPTION OF THE INVENTION

The inventive composite material comprises a blend of a polymer component and ferroelectric ceramic particles. The polymer component of this invention comprises at least one epoxy containing polymer, and at least one polymer having a plurality of epoxy-reactive groups.

The epoxy containing polymer is preferably present in the polymer component an amount of from about 5 wt. % to about 95 wt. % based on the weight of the polymer component, more preferably from about 20 wt. % to about 80 wt. %, and most preferably from about 45 wt. % to about 55 wt. %. Examples of suitable epoxy containing polymers nonexclusively include polymers comprising phenol novolak epoxies, epoxies having an aliphatic or aromatic hydrocarbon backbone derived from bisphenol A or bisphenol F, butadiene-acrylic modified epoxies, or combinations thereof.

The polymer having a plurality of epoxy-reactive groups is preferably present in an amount of from about 5 wt. % to about 95 wt. % based on the weight of the polymer component, more preferably from about 20 wt. % to about 80 wt. %, and most preferably from about 45 wt.% to about 55 wt. %. Examples of epoxy-reactive groups nonexclusively include amine groups, hydroxyl groups, carboxyl groups, and active hydrogen groups. Examples of suitable materials for the polymer having a plurality of epoxy-reactive groups nonexclusively include polyimides, polyamide imides, polyvinyl butyral, polyether sulphone, reactive polyesters, or combinations thereof. In a preferred embodiment, the polymer having a plurality of epoxy-reactive groups comprises a reactive polyester having a plurality of hydroxyl groups.

The polymer component of the inventive composite material is preferably present in an amount ranging from about 10 wt. % to about 99.5 wt. % based on the weight of the composite material, more preferably from about 20 wt. % to about 95 wt. % based on the weight of the composite material, and most preferably from about 40% to about 90% based on the weight of the composite material. The polymer component is preferably present in the form of a solid at room temperature.

The ferroelectric ceramic particles serve as a dielectric, or electrical insulator, in the inventive composite material. Examples of suitable ferroelectric ceramic particles include barium titanate, strontium titanate, barium strontium titanate, boron nitride, aluminum oxide, or combinations thereof. The ferroelectric ceramic particles have a particle size which preferably ranges from about 0.1 μm to about 2 μm, more preferably from about 0.5 μm to about 1 μm. The ferroelectric ceramic particles are preferably present in the form of a powder. A powder is defined as solid particles having an average diameter of about 10 μm or less. In certain embodiments, the average particle size of strontium titanate ranges from about 0.85 μm to about 0.95 μm. In certain embodiments, the average particle size of barium titanate is about 0.55 μm to about 0.60 μm. The ferroelectric ceramic particles are preferably present in an amount ranging from about 0.5 wt. % to about 90 wt. % based on the weight of the composite material, more preferably from about 5 wt. % to about 80 wt. % based on the weight of the composite material, and most preferably from about 10 wt. % to about 60 wt. % based on the weight of the composite material. Examples of the exact makeup of certain embodiments of this invention are shown in Formulations A-K of Table 1 below, as well as in the Examples.

The inventive composite materials may optionally include additional components or additives, such as conventional curing agents, dispersing agents, mixing agents, accelerators, hardeners, catalysts, solvents, and the like. Examples of suitable curing agents nonexclusively include diamines, polybasic acids and anhydrides. Examples of suitable dispersing agents nonexclusively include silanes, neoalkoxy titanates, neoalkoxy zirconates, and copolymers with acidic groups. Examples of suitable catalysts nonexclusively include imidazoles and triphenyl phosphine (TPP). One example of a suitable commercially available catalyst is Curezol, available commercially from Shikoku Chemicals Corporation of Kagawa, Japan. Examples of suitable hardeners nonexclusively include diaminodiphenyl sulphone (DDS) and phenylenediamine. Examples of suitable solvents nonexclusively include methyl ethyl ketone (MEK), dimethyl formamide (DMF), cyclohexanone (CyH), and combinations thereof. In certain embodiments, the inventive composite materials comprise at least one solvent in a sufficient amount such that about 60 wt. % of the overall composite material is present in the form of solids.

The inventive composite materials may be formed by any suitable combining means known in the art, such as mixing, blending, or the like. In a preferred embodiment, the polymer material and the ferroelectric ceramic particles are blended together to form a substantially uniform composite material mixture. The composite material mixture may be formed into any suitable desired shape, and may be allowed to harden into a composite material layer or the like. In certain embodiments, the composite material layer has a thickness ranging from about 4 μm to about 100 μm, preferably from about 8 μm to about 50 μm, and more preferably from about 10 μm to about 35 μm.

Figure 1:
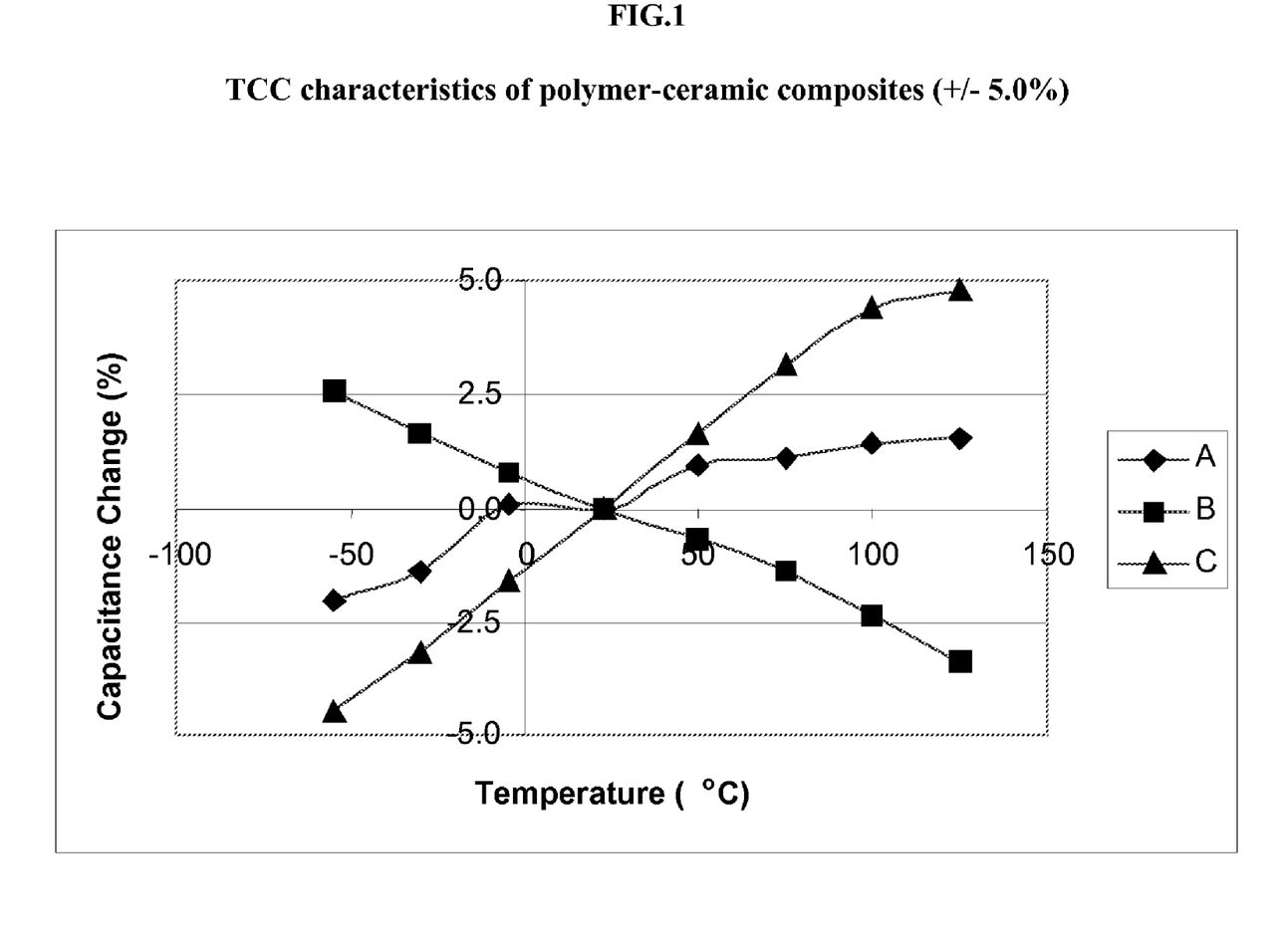
FIG. 1 provides a graphical representation of the TCC characteristics of certain formulations of the inventive composite materials. The formulations shown in this figure exhibit a change in TCC of from about −5% to about +5%, responsive to changes in temperature within the range of from about −55° C. to about 125° C.
Figure 2:
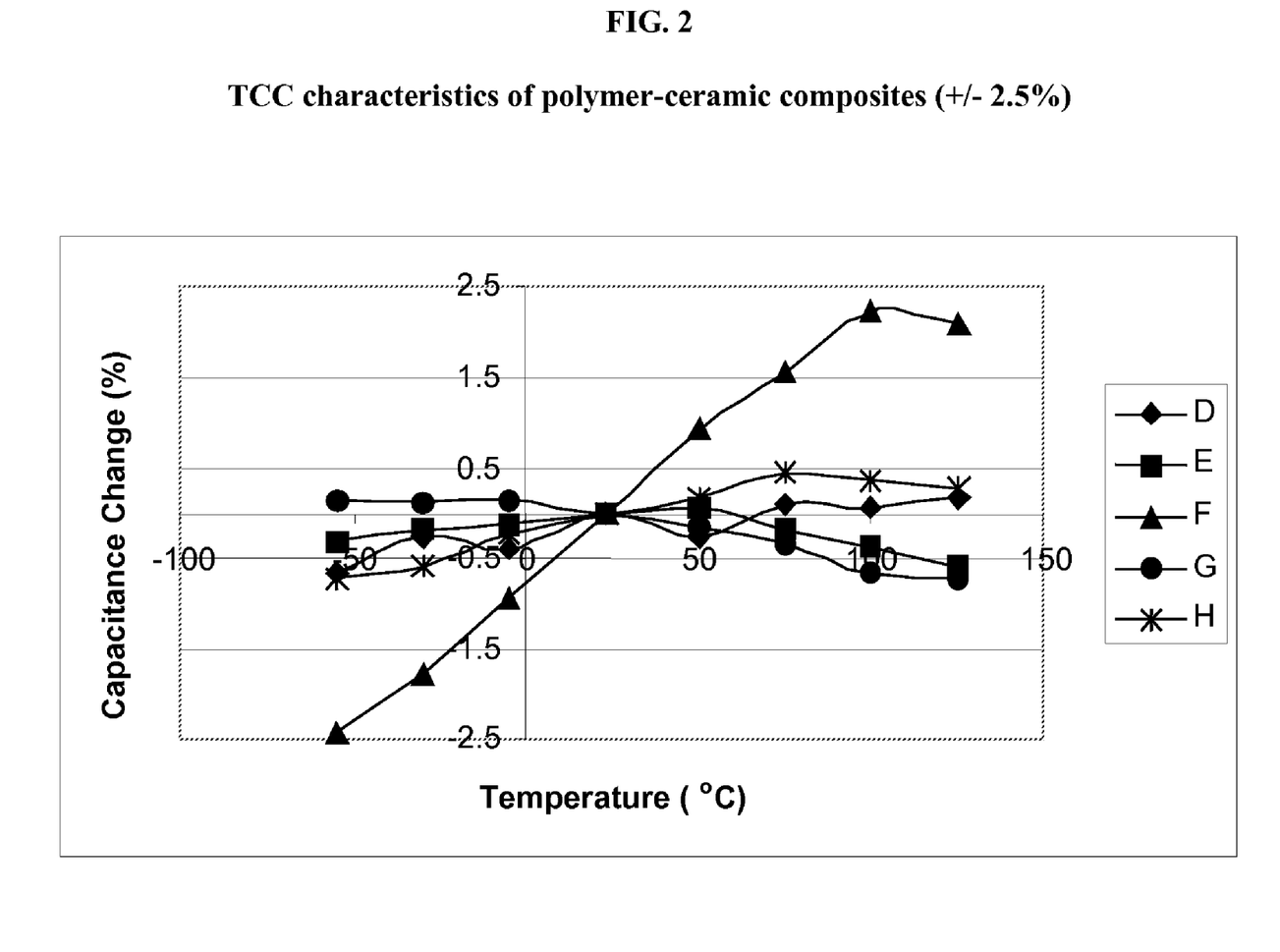
FIG. 2 provides a graphical representation of the TCC characteristics of certain formulations of the inventive composite materials. The formulations shown in this figure exhibit a change in TCC of from about −2.5 to about +2.5%, responsive to changes in temperature within the range of from about −55° C. to about 125° C.
Figure 3:
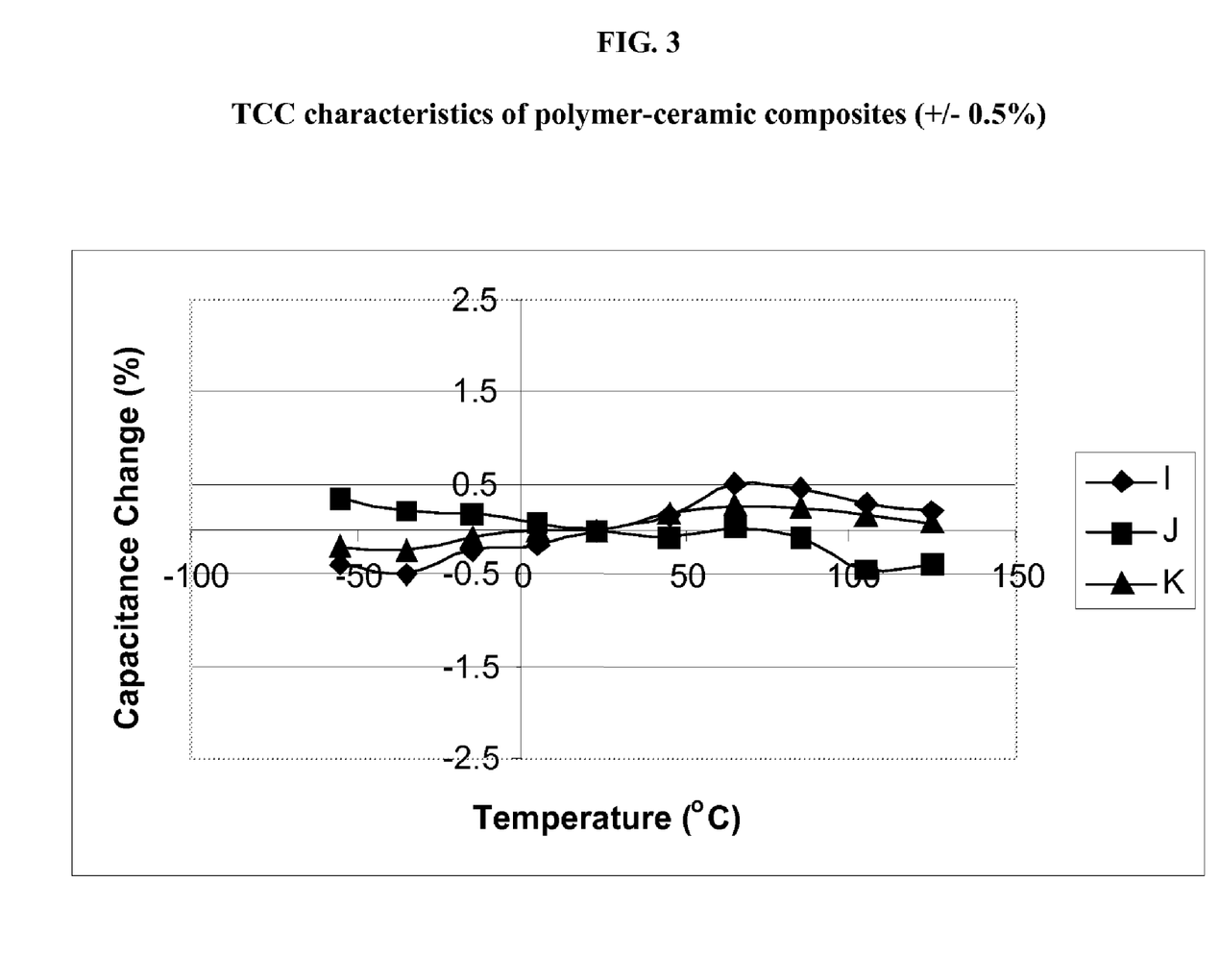
FIG. 3 provides a graphical representation of the TCC characteristics of certain formulations of the inventive composite materials. The formulations shown in this figure exhibit a change in TCC of from about −0.5% to about +0.5%, responsive to changes in temperature within the range of from about −55° C. to about 125° C.

A key feature of this invention is that the composite material preferably exhibits a change in temperature coefficient of capacitance (TCC) of from about −5% to about +5%, responsive to a change in temperature within the range of from about −55° C. to about 125° C. More preferably, a change in TCC of the inventive composite material ranges from about −4% to about +4% responsive to a temperature change within this temperature range, and even more preferably from about −2.5 % to about +2.5% responsive to a change within this temperature range. In a most preferred embodiment, a change in TCC of the inventive composite material ranges from about −0.5% to about +0.5%, responsive to a change in temperature within the range of from about −55° C. to about 125° C. Table 2, below, shows temperature coefficient of capacitance (TCC) properties of the inventive materials in formulations A-K, which are also graphically represented in FIGS. 1-3, and described in detail in the Examples. The data of Table 2 shows the percent capacitance change (Δ TCC) of formulations A-K at temperatures within a range of from −55° C. to 125° C.

The composite materials of this invention also have excellent dielectric constant (DK), and dissipation factor (DF) at 1 MHz. The DK and DF properties of the inventive materials of formulations A-K are also shown in Table 2, below. The composite materials of this invention preferably have a dielectric constant (DK) at of about 2.5 to about 50, more preferably from about 5 to about 50, even more preferably from about 10 to about 40, and most preferably from about 15 to about 30. The dissipation factor (DF) is a measure of the power loss of a capacitor, where DF=2 Π fRC×100%, wherein R is the equivalent series resistance of the capacitor, f is the frequency, and C is capacitance. Dissipation factor varies with frequency and temperature. The dissipation factor (DF) of the inventive materials, at 1 MHz, preferably ranges from about 0.003 to about 0.03 more preferably from about 0.004 to about 0.02 and most preferably from about 0.005 to about 0.015.

The composite materials of this invention may be used in a variety of applications, such as in the formation of capacitors, printed circuit boards, electronic devices and the like. In certain embodiments, the invention provides an article which comprises an electrically conductive layer, and a layer of the inventive composite material on the electrically conductive layer. Such articles may comprise capacitors, printed circuit boards which comprise the inventive capacitors, electronic devices which comprise the inventive capacitors, electronic devices which comprise the inventive printed circuit boards, and the like. One embodiment of this invention includes a capacitor which comprises a first electrically conductive layer, a second electrically conductive layer, and a layer of the inventive composite material attached between the first electrically conductive layer and the second electrically conductive layer. The composite material layer is preferably directly attached to a surface of each of the electrically conductive layers. Another embodiment includes a capacitor which comprises a first article which comprises a first electrically conductive layer having a layer of the inventive composite material on the first electrically conductive layer, and a second article which comprises a second electrically conductive layer having a layer of the inventive composite material on the second electrically conductive layer, with the first and second article being attached to each other such that their layers of the composite material are in contact with each other.

Electrically conductive layers are well known in the art. Examples of electrically conductive layers nonexclusively include metal layers such as metal foils. Examples of suitable materials for such electrically conductive layers nonexclusively include copper, aluminum, nickel, silver, iron nickel alloy, or combinations thereof. A preferred material comprises copper. Where more than one electrically conductive layer is present, the material of each layer is chosen independently, and may comprise either the same material or may comprise different materials. The electrically conductive layer preferably has a thickness ranging from about 3 μm to about 100 μm, more preferably from about 5 μm to about 70 μm, and most preferably from about 10 μm to about 35 μm. As stated above, the composite material layer preferably has a thickness ranging from about 4 μm to about 100 μm, more preferably from about 8 μm to about 50 μm, and most preferably from about 10 μm to about 35 μm.

For purposes of this invention, unless specified, the terms "applying" or "attaching" refer to any well known method of depositing, appending, or joining one layer to the next layer, non-exclusively including coating, dipping, spraying, sputtering, laminating, vapor depositing, electrodeposition, plating, printing, evaporating, and combinations thereof, either simultaneously or sequentially. In certain embodiments, the composite material layer is applied onto a metal layer by coating. In certain embodiments, the attaching of two or more materials is conducted via lamination, such as to form a capacitor laminate. Lamination is preferably conducted at a temperature, pressure, and time appropriate for the materials chosen. In certain embodiments, lamination may be conducted in a press at a temperature of from about 150° C. to about 310° C., more preferably from about 160° C. to about 200° C. Lamination may be conducted for from about 30 minutes to about 120 minutes, preferably from about 40 minutes to about 80 minutes. Preferably, the press is under a vacuum of at least 70 cm (28 inches) of mercury, and maintained at a pressure of about from about 3.5 kgf/cm² (50 psi) to about 28 kgf/cm² (400 psi), preferably from about 4.9 kgf/cm² (70 psi) to about 14 kgf/cm² (200 psi). In addition to lamination, a curing step may be conducted according to any conventionally known curing methods. In certain embodiments, a curing step may be conducted by subjecting the composite material to a temperature of from about 93° C. (200° F.) to about 316° C. (600° F.), for about 1 to about 120 minutes.

This invention further relates to a method for forming a capacitor, which method includes (a) providing a composite material as described above, and (b) attaching a layer of the composite material between a first electrically conductive layer and a second electrically conductive layer. The composite material layer is preferably directly attached to a surface of each of the electrically conductive layers.

Such capacitor formation may be carried out in a variety of ways. In several embodiments, an article is formed by applying a layer of the inventive composite material onto an electrically conductive layer. In certain embodiments, the attaching step (b) above comprises: i) forming a first article comprising the first electrically conductive layer, and a layer of the composite material on the first electrically conductive layer; ii) forming a second article comprising the second electrically conductive layer, and a layer of the composite material on the second electrically conductive layer; and iii) joining the first article and second article together such that the composite material layer of the first article is in contact with the composite material layer of the second article. Optionally but preferably, step iii) comprises laminating the first article and the second article together and/or curing the composite material layers. Suitable electrically conductive layer materials, and details regarding lamination and curing, are provided above. The resulting capacitor structure has a metal-composite-composite-metal arrangement.

In another embodiment, the attaching step (b) comprises: i) applying a layer of the composite material onto a first electrically conductive layer; and ii) applying a second electrically conductive layer onto a surface of the layer of composite material which is on the first electrically conductive layer; and iii) optionally laminating the first electrically conductive layer and the layer of composite material and the second electrically conductive layer together, and/or curing the layer of composite material. The resulting capacitor structure has a metal-composite-metal arrangement.

In still another embodiment, the attaching step (b) comprises: i) applying a layer of the composite material onto a first electrically conductive layer; then ii) curing the layer of composite material; and then iii) forming a second electrically conductive layer on a surface of the composite material, which surface is opposite the first metal layer, via sputtering. The resulting capacitor structure also has a metal-composite-metal arrangement. Additionally, after formation of a capacitor of this invention, circuit patterns may also be created in the electrically conductive layer using known etching techniques.

Capacitors formed with the inventive polymer-ceramic composite material exhibit several desirable properties in addition to the desirable TCC, DK and DF properties described above. For example, capacitors formed with the inventive polymer-ceramic composite material on an electrically conductive layer such as a copper foil preferably exhibit a good 90-degree peel strength of 0.5 kN/m or greater, and preferably 1 kN/m or greater. Furthermore, capacitors of this invention exhibit very high thermal stability at solder temperatures of about 288° C. In one embodiment, a capacitor laminate of this invention is formed to include the inventive polymer-ceramic composite material on copper foil, wherein the composite material contains 20 wt. % polymer component and 80 wt. % ferroelectric ceramic particles. The capacitor laminate of this embodiment passes 10 times of a solder float test at 288° C.

This invention further provides a method of forming a printed circuit board, which comprises incorporating a capacitor as formed above, into a printed circuit board. Further embodiments of this invention nonexclusively include the formation of printed circuit boards comprising the inventive capacitors, electronic devices comprising the inventive printed circuit boards, electronic devices comprising the inventive capacitors, and the like.

The following non-limiting examples serve to illustrate the invention. It will be appreciated that variations in proportions and alternatives in elements of the components of the invention will be apparent to those skilled in the art and are within the scope of the present invention.

EXAMPLE 1

Table 1, below, shows formulations A-K of the present invention. Formulation A serves as a control material, and is made up entirely of the polymer component of the invention. Formulations B-K relate to the inventive composite materials, and contain various combinations of the polymer component and ferroelectric ceramic particles. In Table 1, strontium titanate is abbreviated with the term "ST", and barium titanate is abbreviated with the term "BT", followed by their average particle diameter, and their weight in grams.

TABLE 1

Composite Material Formulations

| Materials | A(cntrl) | B | C | D | E | F | G | H | I | J | K |
|---|---|---|---|---|---|---|---|---|---|---|---|
| Polymer component wt, g | 100.0 | 20.0 | 22.0 | 45.0 | 30.0 | 22.0 | 22.0 | 22.0 | 22.0 | 20.0 | 20.0 |
| ST 1 (0.85 μm) wt, g | — | 80.0 | — | — | — | — | — | — | — | — | — |
| ST 2 (0.87 μm) wt, g | — | — | — | — | — | — | — | — | — | 48.0 | 43.2 |
| ST 3 (0.95 μm) wt, g | — | — | — | 33.0 | 42.0 | 23.4 | 42.1 | 46.8 | 54.6 | — | — |
| BT (0.59 μm) wt, g | — | — | 78.0 | 22.0 | 28.0 | 54.6 | 35.9 | 31.2 | 23.4 | 32.0 | 36.8 |
| Dispersing agt.wt, g | — | 0.12 | 0.11 | 0.11 | 0.06 | 0.11 | 0.08 | 0.00 | 0.14 | 0.12 | 0.11 |

Table 2 shows characteristics of the inventive formulations A-F. Specifically, Table 2 shows the DK and DF properties of formulations A-F, as well as the percent capacitance change (Δ TCC) of each formulation at temperatures within a range of from −55° C. to 125° C. The data of Table 2 relating to TCC is represented graphically in FIGS. 1-3.

TABLE 2

Composite Material Characteristics

| Properties | A (cntr) | B | C | D | E | F | G | H | I | J | K |
|---|---|---|---|---|---|---|---|---|---|---|---|
| DK | — | 28 | 21 | 8 | 12 | 18 | 21 | 22 | 21 | 25 | 27 |
| DF (1 MHz) | — | 0.003 | 0.009 | 0.004 | 0.007 | 0.008 | 0.005 | 0.008 | 0.008 | 0.004 | 0.005 |
| TCC Change, % (−55° C.) | — | 2.6 | −4.5 | −0.7 | −0.3 | −2.4 | 0.1 | −0.7 | −0.4 | 0.3 | −0.2 |
| TCC Change, % (125° C.) | — | −3.4 | 4.8 | 0.2 | −0.6 | 2.1 | −0.7 | 0.3 | 0.2 | −0.4 | 0.1 |

Formulation A

The inventive composite materials include a blend of a polymer component and ferroelectric ceramic particles. The polymer component of these Examples was formed by blending Composition 1 with Composition 2, below, in a weight ratio of 75:25.

Composition 1:

| | |
|---|---|
| 9.0 g | Epoxidized copolymer of phenol and aromatic hydrocarbon |
| 28 g | Elastomer-toughened epoxidized phenol novolak |
| 7.2 g | Bisphenol F epoxy |
| 74.8 g | Polyester having functional group polymerizable with epoxy; 65% in Toluene |
| 6.8 g | Polyvinylbutyral |
| 0.5 g | 2-phenyl-4-methyl-5-hydroxymethyl imidazole |
| 123.9 g | Solvent mixture of 80% methylethylketone and 20% dimethylformamide |

Composition 2:

| | |
|---|---|
| 20 g | Epoxidized copolymer of phenol and aromatic hydrocarbon |
| 15 g | Epoxy polymer - Oxirane, 2,2'-[[1-[4-[1-methyl-1-[4-[(oxyranylmethoxy) phenyl] ethyl] phenyl] ethyledene] bis(4,1-phenyleneoxymethylene)]bis |
| 15 g | Bisphenol A epoxy |
| 48 g | Polyethersulfone |
| 0.30 g | 2-phenyl-4-methyl-5-hydroxymethyl imidazole |
| 1.5 g | Diaminodiphenyl Sulphone |
| 0.20 g | Triphenyl phosphine |
| 150 g | Solvent mixture of 23% methylethylketone, 62% cyclohexanone, and 15% dimethylformamide |

Formulation A of Table 1 contains 100 g of the resulting polymer component.

EXAMPLE 2

Formulation B

The inventive composite material according to Formulation B was formed by blending 20 g of the polymer component blend of Example 1, with 80 g of strontium titanate (85 μm particles) and 0.12 g of a dispersing agent, as shown in Table 1.

Formulation B exhibited a DK of 28 and DF of 0.003 at 1 MHz, and changes in temperature coefficient of capacitance of 2.6% at −55° C., and −3.4% at 125° C. as shown in Table 2.

EXAMPLE 3

Formulation C

The inventive composite material according to Formulation C was formed by blending 22 g of the polymer component blend of Example 1, with 78 g of barium titanate, and 0.11 g of a dispersing agent, as shown in Table 1.

Formulation C exhibited a DK of 21 and DF of 0.009 at 1 MHz, and changes in temperature coefficient of capacitance of −4.5% at −55° C., and 4.8% at 125° C. as shown in Table 2.

EXAMPLE 4

Formulation D

The inventive composite material according to Formulation D was formed by blending 45 g of the polymer component blend of Example 1, with 33 g of strontium titanate (95 μm particles), 22 g of barium titanate, and 0.11 g of a dispersing agent, as shown in Table 1.

Formulation D exhibited a DK of 8 and DF of 0.004 at 1 MHz, and changes in temperature coefficient of capacitance of −0.7% at −55° C., and 0.2% at 125° C. as shown in Table 2.

EXAMPLE 5

Formulation E

The inventive composite material according to Formulation E was formed by blending 30 g of the polymer component blend of Example 1, with 42 g of strontium titanate (95 μm particles), 28 g of barium titanate, and 0.06 g of a dispersing agent, as shown in Table 1.

Formulation E exhibited a DK of 12 and DF of 0.007 at 1 MHz, and changes in temperature coefficient of capacitance of −0.3% at −55° C., and −0.6% at 125° C. as shown in Table 2.

EXAMPLE 6

Formulation F

The inventive composite material according to Formulation F was formed by blending 22 g of the polymer component blend of Example 1, with 23.4 g of strontium titanate (95 μm particles), 54.6 g of barium titanate, and 0.11 g of a dispersing agent, as shown in Table 1.

Formulation F exhibited a DK of 18 and DF of 0.008 at 1 MHz, and changes in temperature coefficient of capacitance of −2.4% at −55° C., and 2.1% at 125° C. as shown in Table 2.

EXAMPLE 7

Formulation G

The inventive composite material according to Formulation G was formed by blending 22 g of the polymer component blend of Example 1, with 42.1 g of strontium titanate (95 μm particles), 35.9 g of barium titanate, and 0.08 g of a dispersing agent, as shown in Table 1.

Formulation G exhibited a DK of 21 and DF of 0.005 at 1 MHz, and changes in temperature coefficient of capacitance of 0.1% at −55° C., and −0.7% at 125° C. as shown in Table 2.

EXAMPLE 8

Formulation H

The inventive composite material according to Formulation H was formed by blending 22 g of the polymer component blend of Example 1, with 46.8 g of strontium titanate (95 μm particles), and 31.2 g of barium titanate, as shown in Table 1.

Formulation H exhibited a DK of 22 and DF of 0.008 at 1 MHz, and changes in temperature coefficient of capacitance of −0.4% at −55° C., and 0.2% at 125° C. as shown in Table 2.

EXAMPLE 9

Formulation I

The inventive composite material according to Formulation I was formed by blending 22 g of the polymer component blend of Example 1, with 54.6 g of strontium titanate (95 μm particles), 23.4 g of barium titanate, and 0.14 g of a dispersing agent, as shown in Table 1.

Formulation I exhibited a DK of 21 and DF of 0.008 at 1 MHz, and changes in temperature coefficient of capacitance of −0.4% at −55° C., and 0.2% at 125° C. as shown in Table 2.

EXAMPLE 10

Formulation J

The inventive composite material according to Formulation J was formed by blending 20 g of the polymer component blend of Example 1, with 48 g of strontium titanate (87 μm particles), 32 g of barium titanate, and 0.12 g of a dispersing agent, as shown in Table 1.

Formulation J exhibited a DK of 2246 and DF of 0.004 at 1 MHz, and changes in temperature coefficient of capacitance of 0.3% at −55° C., and −0.4% at 125° C. as shown in Table 2.

EXAMPLE 11

Formulation K

The inventive composite material according to Formulation K was formed by blending 20 g of the polymer component blend of Example 1, with 43.2 g of strontium titanate (0.87 μm particles), 36.8 g of barium titanate, and 0.11 g of a dispersing agent, as shown in Table 1.

Formulation K exhibited a DK of 27 and DF of 0.005 at 1 MHz, and changes in temperature coefficient of capacitance of −0.2% at −55° C., and 0.1% at 125° C. as shown in Table 2.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A composite material which comprises a blend of a polymer component and ferroelectric ceramic particles, which polymer component comprises at least one epoxy containing polymer, in an amount of from about 5 wt. % to about 95 wt. % based on the weight of the polymer component, and at least one polymer having a plurality of epoxy-reactive groups in an amount of from about 5 wt. % to about 95wt. % based on the weight of the polymer component,
wherein the composite material exhibits a change in temperature coefficient of capacitance of from about −5% to about +5%, responsive to a temperature change within the range of from about −55° C. to about 125° C.

2. The composite material of claim 1 wherein the epoxy containing polymer comprises a phenol novolak epoxy, an epoxy having an aliphatic or aromatic hydrocarbon backbone derived from bisphenol A or bisphenol F, a butadiene-acrylic modified epoxy, or combinations thereof.

3. The composite material of claim 1 wherein the polymer having a plurality of epoxy-reactive groups comprises a polyimide, a polyamideimide, a polyvinyl butyral, a polyethersulphone, a reactive polyester, or combinations thereof.

4. The composite material of claim 1 wherein the polymer having a plurality of epoxy-reactive groups comprises a polyester having a plurality of hydroxyl groups.

5. The composite material of claim 1 wherein the ferroelectric ceramic particles comprise barium titanate, strontium titanate, barium strontium titanate, or combinations thereof.

6. The composite material of claim 1 wherein the ferroelectric ceramic particles are present in the form of a powder.

7. The composite material of claim 1 which exhibits a change in temperature coefficient of capacitance of from about −2.5% to about +2.5%, responsive to a temperature change within the range of from about −55° C. to about 125° C.

8. The composite material of claim 1 which exhibits a change in temperature coefficient of capacitance of from about −0.5% to about +0.5%, responsive to a temperature change within the range of from about −55° C. to about 125° C.

9. The composite material of claim 1 which has a dielectric constant of from about 15 to about 30.

10. An article which comprises an electrically conductive layer, and a layer of the composite material of claim 1 on the electrically conductive layer.

11. A capacitor which comprises a first electrically conductive layer, a second electrically conductive layer and a layer of the composite material of claim 1 attached between the first electrically conductive layer and the second electrically conductive layer.

12. The capacitor of claim 11 wherein the first electrically conductive layer and the second electrically conductive layer independently comprise copper, aluminum, nickel, silver, iron nickel alloy, or combinations thereof.

13. The capacitor of claim 11 wherein the first electrically conductive layer and the second electrically conductive layer comprise copper.

14. A printed circuit board comprising the capacitor of claim 11.

15. An electronic device comprising the printed circuit board of claim 14.

16. An electronic device comprising the capacitor of claim 11.

17. A capacitor which comprises:
a) a first article which comprises a first electrically conductive layer, and a layer of the composite material of claim 1 on the first electrically conductive layer; and
b) a second article which comprises a second electrically conductive layer, and a layer of the composite material of claim 1 on the second electrically conductive layer
the first and second article being attached to each other such that their layers of the composite material are in contact with each other.

18. A composite material which comprises a blend of a polymer component and a ferroelectric ceramic powder, which polymer component comprises at least one epoxy containing polymer, in an amount of from about 5 wt. % to about 95 wt. % based on the weight of the polymer component, and at least one polymer having a plurality of epoxy-reactive groups in an amount of from about 5 wt. % to about 95wt. % based on the weight of the polymer component;
wherein the ferroelectric ceramic powder comprises barium titanate, strontium titanate, barium strontium titanate, or combinations thereof;
wherein the epoxy containing polymer comprises a phenol novolak epoxy, an epoxy having an aliphatic or aromatic hydrocarbon backbone derived from bisphenol A or bisphenol F, a butadiene-acrylic modified epoxy, or combinations thereof;
wherein the polymer having a plurality of epoxy-reactive groups comprises a polyimide, a polyamideimide, a polyvinyl butyral, a polyethersulphone, a reactive polyester, or combinations thereof; and
wherein the composite material exhibits a change in temperature coefficient of capacitance of from about −5% to about +5%, responsive to a temperature change within the range of from about −55° C. to about 125° C.

19. A method for forming a capacitor which comprises:
a) providing a composite material which comprises a blend of a polymer component and ferroelectric ceramic particles, which polymer component comprises at least one epoxy containing polymer, in an amount of from about 5wt. % to about 95 wt. % based on the weight of the polymer component, and at least one polymer having a plurality of epoxy-reactive groups in an amount of from about 5 wt. % to about 95 wt. % based on the weight of the polymer component, wherein the composite material exhibits a change in temperature coefficient of capacitance of from about −5% to about +5%, responsive to a temperature change within the range of from about −55° C. to about 125° C.; and b) attaching a layer of the composite material between a first electrically conductive layer and a second electrically conductive layer.

20. The method of claim 19 wherein the attaching step (b) comprises:
   i) forming a first article comprising the first electrically conductive layer, and a layer of the composite material on the first electrically conductive layer;
   ii) forming a second article comprising the second electrically conductive layer, and a layer of the composite material on the second electrically conductive layer; and
   iii) joining the first article and second article together such that the composite material layer of the first article is in contact with the composite material layer of the second article.

21. The method of claim 20 wherein step iii) comprises laminating the first article and the second article together and/or curing the composite material layers.

22. The method of claim 19 wherein the attaching step (b) comprises:
   i) applying a layer of the composite material onto a first electrically conductive layer; and
   ii) applying a second electrically conductive layer onto a surface of the layer of composite material which is on the first electrically conductive layer; and
   iii) optionally laminating the first electrically conductive layer and the layer of composite material and the second electrically conductive layer together, and/or curing the layer of composite material.

23. The method of claim 19 wherein the attaching step (b) comprises:
   i) applying a layer of the composite material onto a first electrically conductive layer; then
   ii) curing the layer of composite material; and then
   iii) forming a second electrically conductive layer on a surface of the composite material which surface is opposite the first metal layer, via sputtering.

24. The method of claim 19 wherein the epoxy containing polymer comprises a phenol novolak epoxy, an epoxy having an aliphatic or aromatic hydrocarbon backbone derived from bisphenol A or bisphenol F, a butadiene-acrylic modified epoxy or combinations thereof.

25. The method of claim 19 wherein the ferroelectric ceramic particles comprise barium titanate, strontium titanate, barium strontium titanate, or combinations thereof.

26. The method of claim 19 wherein the polymer having a plurality of epoxy-reactive groups comprises a polyimide, a polyamideimide, a polyvinyl butyral, a polyethersulphone, a reactive polyester, or combinations thereof.

27. A method of forming a printed circuit board, which comprises incorporating a capacitor formed according to claim 19 into a printed circuit board.

* * * * *